(12) United States Patent
Jung et al.

(10) Patent No.: US 12,615,927 B2
(45) Date of Patent: Apr. 28, 2026

(54) LIGHT EMITTING DISPLAY DEVICE AND VEHICLE INCLUDING THE SAME

(71) Applicant: Samsung Display Co., LTD., Yongin-si (KR)

(72) Inventors: Eui Suk Jung, Yongin-si (KR); Tae Joon Kim, Yongin-si (KR); Dong Hyun Yang, Yongin-si (KR); Wonseon Yu, Yongin-si (KR); Hyeon Bum Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 393 days.

(21) Appl. No.: 18/451,188

(22) Filed: Aug. 17, 2023

(65) Prior Publication Data

US 2024/0065047 A1 Feb. 22, 2024

(30) Foreign Application Priority Data

Aug. 22, 2022 (KR) ........................ 10-2022-0104872

(51) Int. Cl.
*H10K 59/38* (2023.01)
*H10K 59/122* (2023.01)
*H10K 59/126* (2023.01)
*H10K 59/35* (2023.01)

(52) U.S. Cl.
CPC ......... *H10K 59/126* (2023.02); *H10K 59/122* (2023.02); *H10K 59/352* (2023.02); *H10K 59/38* (2023.02)

(58) Field of Classification Search
CPC .............................. H10K 59/38; H10K 59/122

USPC .................................................. 313/498–512
See application file for complete search history.

(56) References Cited

U.S. PATENT DOCUMENTS

| | | | |
|---|---|---|---|
| 2010/0271721 A1 | 10/2010 | Gaides et al. | |
| 2019/0185743 A1* | 6/2019 | Kim .................... | C08G 77/388 |
| 2020/0091464 A1 | 3/2020 | Park et al. | |
| 2021/0135141 A1 | 5/2021 | Park et al. | |
| 2021/0167144 A1 | 6/2021 | Lim et al. | |
| 2022/0384755 A1 | 12/2022 | Park et al. | |
| 2023/0126371 A1* | 4/2023 | Kim ........................ | H10K 50/12 257/40 |
| 2024/0138176 A1 | 4/2024 | Park et al. | |

(Continued)

FOREIGN PATENT DOCUMENTS

| | | |
|---|---|---|
| KR | 10-1787978 | 10/2017 |
| KR | 10-2019-0044902 | 5/2019 |

(Continued)

OTHER PUBLICATIONS

Office Action dated Feb. 24, 2026 for corresponding Korean Patent Application No. 10-2022-0104872, In Korean, 10 pages.

*Primary Examiner* — Christopher M Raabe

(57) ABSTRACT

According to embodiments, a light emitting display device and a vehicle including the light emitting display device include a light emitting diode disposed on a substrate and including a light emitting layer; a pixel defining layer having an opening corresponding to the light emitting layer; light blocking linear patterns disposed on the pixel defining layer and the light emitting layer and extending in a first direction; a color converting layer disposed between the light blocking linear patterns; and an upper transparent organic layer disposed between the light blocking linear patterns and disposed on the color converting layer.

20 Claims, 14 Drawing Sheets

(56)                    References Cited

U.S. PATENT DOCUMENTS

| | | | | |
|---|---|---|---|---|
| 2024/0397804 A1* | 11/2024 | Park | .................. | H10K 59/8792 |
| 2025/0275452 A1* | 8/2025 | Shin | .................. | H10K 59/8792 |

FOREIGN PATENT DOCUMENTS

| | | | |
|---|---|---|---|
| KR | 10-2020-0032294 | A | 3/2020 |
| KR | 10-2020-0063591 | | 6/2020 |
| KR | 10-2021-0069776 | A | 6/2021 |
| KR | 10-2021-0092351 | | 7/2021 |
| KR | 10-2021-0094266 | | 7/2021 |

* cited by examiner $\left.\begin{array}{c} BL\text{-}1 \\ BL\text{-}2 \end{array}\right\} BL$

BL-1 ⎫
      ⎬ BL
BL-2 ⎭

(A)

(B)

(A)

BL (B)

FW

DD

LIGHT EMITTING DISPLAY DEVICE AND VEHICLE INCLUDING THE SAME

CROSS-REFERENCE TO RELATED APPLICATION(S)

This application claims priority to and benefits of Korean Patent Application No. 10-2022-0104872 under 35 U.S.C. § 119 filed in the Korean Intellectual Property Office on Aug. 22, 2022, the entire contents of which are incorporated herein by reference.

BACKGROUND

1. Technical Field

The disclosure relates to a light emitting display device and a vehicle having the light emitting display device, and, to a light emitting display device that may include light blocking linear patterns on a front surface of a light emitting layer and a vehicle having the light emitting display device.

2. Description of the Related Art

A display device is a device for displaying an image, and may include a liquid crystal display (LCD), an organic light emitting diode (OLED) display, and the like. The display device is used in various electronic devices such as a mobile phone, a navigation device, a digital camera, an electronic book, a portable game machine, and various terminals.

The display device may be used in various fields other than the electronic device, and in a case of a vehicle, a conventional analog instrument panel and center fascia are being digitized by using a display device.

The above information disclosed in this background section is only for enhancement of understanding of the background of the described technology, and therefore it may contain information that does not form the prior art that may be already known to a person of ordinary skill in the art.

SUMMARY

Embodiments are for preventing light emitted from a display device from being emitted in a specific (or given) direction while preventing a reduction in front luminance.

Embodiments are for preventing light emitted from a display device used in a vehicle from being incident on a driver's eyes to not interfere with driving.

Embodiments are for preventing a display device used in a vehicle from being reflected on a windshield of the vehicle at night to not obstruct a driver's view.

A light emitting display device may include a light emitting diode disposed on a substrate and including a light emitting layer; a pixel defining layer having an opening corresponding to the light emitting layer; light blocking linear patterns disposed on the pixel defining layer and the light emitting layer and extending in a first direction; a color converting layer disposed between the light blocking linear patterns; and an upper transparent organic layer disposed between the light blocking linear patterns and disposed on the color converting layer.

The light blocking linear patterns may include a first light blocking linear pattern and a second light blocking linear pattern, and the first light blocking linear pattern may not overlap the opening of the pixel defining layer in a plan view, and the second light blocking linear pattern may intersect the opening of the pixel defining layer in the first direction.

The second light blocking linear pattern may intersect the light emitting layer in a plan view, and may overlap the light emitting layer in a plan view.

A width the first light blocking linear pattern in a direction perpendicular to the first direction may be greater than a width of the second light blocking linear pattern in the direction perpendicular to the first direction.

A height of the color converting layer may be about 15% or more and about 85% or less than a height of the first light blocking linear pattern.

A height of the upper transparent organic layer may correspond to a remaining height of the first light blocking linear pattern.

The light emitting display device may further include a transparent scattering layer disposed between the light blocking linear patterns and disposed below the upper transparent organic layer and replacing the color converting layer.

A light blocking member and a color filter may be further disposed on the light blocking linear patterns and the upper transparent organic layer; the light blocking member may have an opening overlapping the opening of the pixel defining layer in a plan view; and the color filter may be disposed within the opening of the light blocking member.

The light emitting display device may further include an additional light blocking linear pattern and the light blocking member may be made of a same at a position overlapping the second light blocking linear pattern in a plan view.

The light blocking linear patterns may have a viewing angle so that light emitted from the light emitting layer is not emitted at a selectable angle or more with respect to a normal line, and the viewing angle may be about 30 degrees.

A vehicle may include a first light emitting display device, wherein the first light emitting display device may include a light emitting diode disposed on a substrate and including a light emitting layer; a pixel defining layer having an opening corresponding to the light emitting layer; light blocking linear patterns disposed on the pixel defining layer and the light emitting layer and extending in a first direction; a color converting layer disposed between the light blocking linear patterns; and an upper transparent organic layer disposed between the light blocking linear patterns and disposed on the color converting layer.

The light blocking linear patterns may include a first light blocking linear pattern and a second light blocking linear pattern, and the first light blocking linear pattern may not overlap the opening of the pixel defining layer in a plan view, and the second blocking linear pattern may intersect the opening of the pixel defining layer in the first direction.

The second light blocking linear pattern may intersect the light emitting layer in a plan view, and may overlap the light emitting layer in a plan view.

A width the first light blocking linear pattern in a direction perpendicular to the first direction may be greater than a width of the second light blocking linear pattern in the direction perpendicular to the first direction.

A height of the color converting layer may be about 15% or more and about 85% or less than a height of the first light blocking linear pattern, and a height of the upper transparent organic layer may correspond to a remaining height of the first light blocking linear pattern.

The vehicle may further include a transparent scattering layer disposed between the light blocking linear patterns and disposed below the upper transparent organic layer and replacing the color converting layer.

A light blocking member and a color filter may be disposed on the light blocking linear patterns and the upper transparent organic layer; the light blocking member may have an opening overlapping the opening of the pixel defining layer in a plan view; and the color filter may be disposed within the opening of the light blocking member.

The vehicle may further include an additional light blocking linear pattern and the light blocking member made of a same material at a position overlapping the second light blocking linear pattern in a plan view.

The light blocking linear patterns may have a viewing angle so that light emitted from the light emitting layer is not emitted at a selectable angle or more with respect to a normal line, and the viewing angle may be about 30 degrees.

The vehicle may further include a second light emitting display device; and the second light emitting display device may include a light emitting diode disposed on a substrate and including a light emitting layer; a pixel defining layer having an opening corresponding to the light emitting layer; and light blocking linear patterns disposed on the pixel defining layer and the light emitting layer and extending in a second direction different from the first direction.

According to embodiments, it is possible to prevent light provided from a light emitting layer from being emitted in a specific (or given) direction by forming light blocking linear patterns on a front surface of the light emitting layer in one direction or a direction, and it is possible to reduce a decrease in luminance at the front by including a color converting layer so as to not be exposed to the front between the light-blocking linear patterns.

Light emitted from a display device used in a vehicle is not provided to a windshield of the vehicle, so that it is possible to prevent the light from being reflected on the windshield of the vehicle at night to not obstruct a driver's view.

Light emitted from a display device positioned at a passenger seat side is not incident on a driver so that driving is not disturbed.

Compared with a comparative example in which a light blocking linear pattern is formed on a front surface of a light emitting layer in a form of a film, an embodiment is directly formed in a light emitting display device, so that there is no problem of misalignment, the moiré phenomenon may be eliminated, and a thickness thereof may be thin, a manufacturing cost may be reduced, and transmittance may be high.

BRIEF DESCRIPTION OF THE DRAWINGS

The above and other aspects and features of the disclosure will become more apparent by describing in detail embodiments thereof with reference to the attached drawings, in which:

FIG. 3 illustrates a schematic top plan view of a light emitting display device in which FIG. 1 and FIG. 2 are combined.

DETAILED DESCRIPTION OF THE EMBODIMENTS

Figure 1:
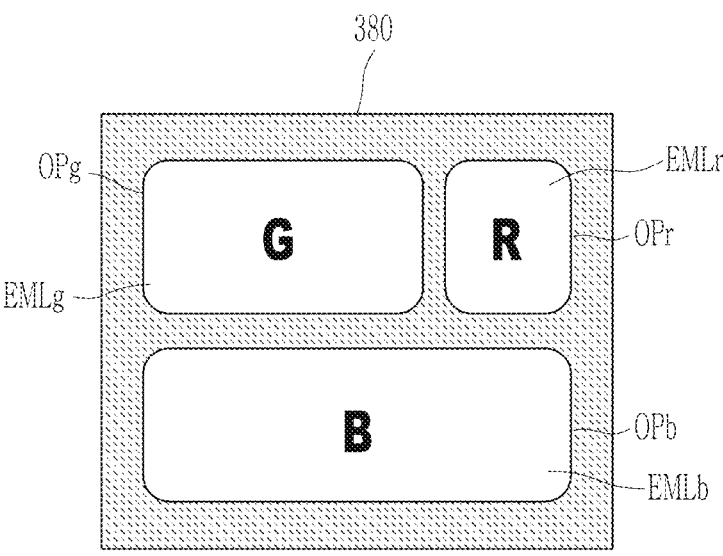
FIG. 1 illustrates a schematic top plan view of a pixel of a light emitting display device according to an embodiment.

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

In order to clearly describe the disclosure, parts or portions that may be irrelevant to the description may be omitted, and identical or similar constituent elements throughout the specification are denoted by the same reference numerals.

Further, in the drawings, the size and thickness of each element are arbitrarily illustrated for ease of description, and the disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, area, substrate, plate, or constituent element is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In addition, throughout the specification, "connected" does not only mean when two or more elements are directly connected, but when two or more elements are indirectly connected through other elements, and when they are physically connected or electrically connected, and further, it may be referred to by different names depending on a position or function, and may also be referred to as a case in which respective parts that are substantially integrated are linked to each other.

In addition, throughout the specification, when it is said that an element such as a wire, layer, film, region, area, substrate, plate, or constituent element "is extended (or extends) in a first direction or second direction", this does not mean only a straight shape extending straight in the corresponding direction, but may mean a structure that substantially extends in the first direction or the second direction, is partially bent, has a zigzag structure, or extends while having a curved structure.

In addition, both an electronic device (for example, a mobile phone, a TV, a monitor, a laptop computer, etc.) including a display device, or a display panel described in the specification, and an electronic device including a display device and a display panel manufactured by a manufacturing method described in the specification are not excluded from the scope of the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a light blocking linear pattern formed in a light emitting display device according to an embodiment will be described with reference to FIG. 1 to FIG. 4.

Figure 2:
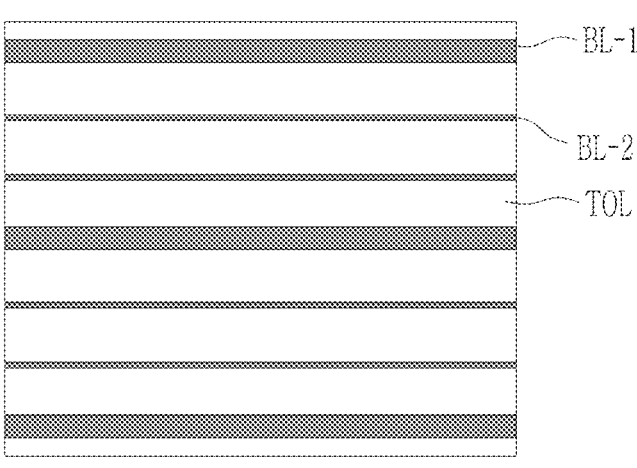
FIG. 2 illustrates a schematic top plan view of light blocking linear patterns and an upper transparent organic layer formed in a light emitting display device according to an embodiment.
Figure 3:
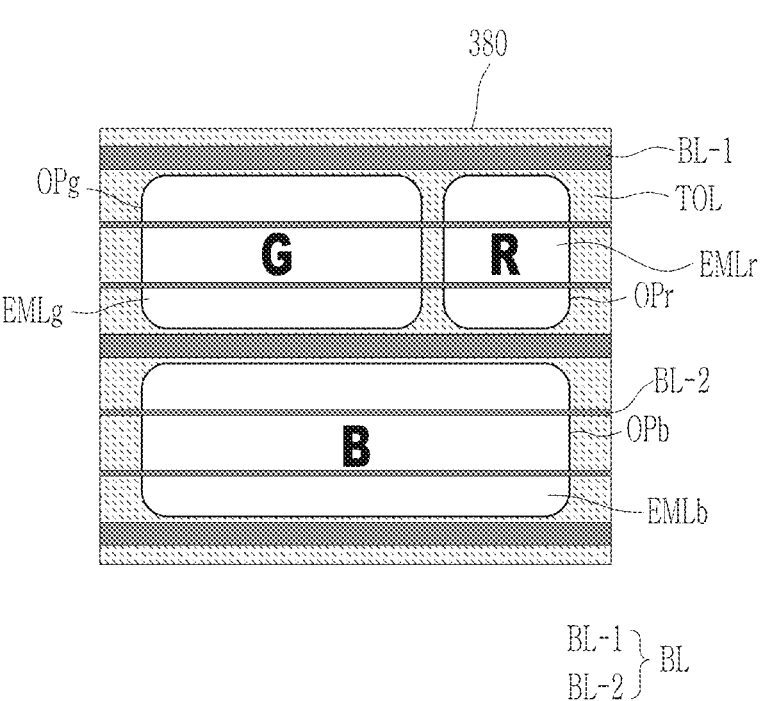
Figure 4:
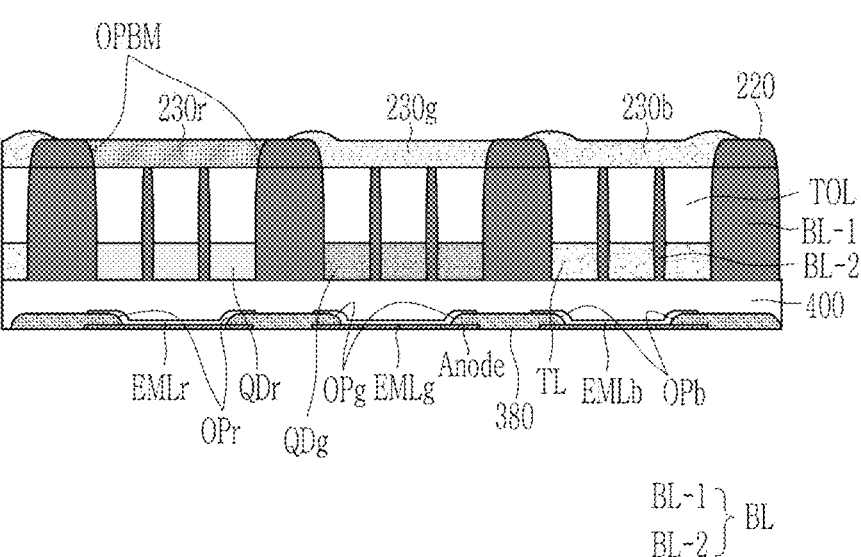
FIG. 4 illustrates a schematic cross-sectional view of a light emitting display device according to an embodiment.

FIG. 1 illustrates a schematic top plan view of a pixel of a light emitting display device according to an embodiment, FIG. 2 illustrates a schematic top plan view of light blocking linear patterns and an upper transparent organic layer formed in a light emitting display device according to an embodiment, FIG. 3 illustrates a schematic top plan view of a light emitting display device in which FIG. 1 and FIG. 2 are combined, and FIG. 4 illustrates a schematic cross-sectional view of a light emitting display device according to an embodiment.

In FIG. 1, three light emitting diodes displaying different colors R, G, and B positioned adjacent to each other are schematically illustrated, and respective light emitting diodes include light emitting layers EMLr, EMLg, and EMLb.

Each light emitting layer EMLr, EMLg, or EMLb is a portion that emits light from the light emitting diode, and is partitioned by a pixel defining layer 380. Each of the light emitting layers EMLr, EMLg, and EMLb have a structure that overlaps each of openings OPr, OPg, and OPb positioned on the pixel defining layer 380, and at least some or a number of the light emitting layers EMLr, EMLg, and EMLb may have a structure that is upwardly exposed without overlapping the pixel defining layer 380. In an embodiment, each of the light emitting layers EMLr, EMLg, and EMLb may be positioned only in each of the opening OPr, OPg, and OPb of the pixel defining layer 380. Although not shown in FIG. 1, a cathode and an encapsulation layer may be positioned on the pixel defining layer 380 and the light emitting layers EMLr, EMLg, and EMLb, and an anode is positioned under (or below) respective light emitting layers EMLr, EMLg, and EMLb. Here, one anode, one light emitting layer (EMLr, EMLg, or EMLb), and one cathode may form one light emitting diode. Here, the light emitting layers EMLr, EMLg, and EMLb may emit light of different colors, but hereinafter, an embodiment in which the light emitting layers EMLr, EMLg, and EMLb respectively emit the same wavelength will be described, and, an embodiment in which the emitted light is blue light will be described. A detailed stacked structure of the light emitting diode will be described with reference to FIG. 13 and FIG. 14.

FIG. 2 illustrates a planar structure of light blocking linear patterns BL that is disposed on an upper portion of a light emitting diode and an upper transparent organic layer TOL positioned on a periphery thereof.

The light blocking linear pattern BL extends in one direction or a direction, and may include a first light blocking linear pattern BL-1 and a second light blocking linear pattern BL-2 having different widths in a direction perpendicular to an extension direction in a plan view. Here, the first light blocking linear pattern BL-1 and the second light blocking linear pattern BL-2 may have a same height.

The first light blocking linear pattern BL-1 extends in one direction or a direction, and has a thick width in a direction perpendicular to an extension direction in a plan view, and referring to FIG. 3, it does not overlap each of the light emitting layers EMLr, EMLg, and EMLb, and it overlaps only the pixel defining layer 380 in a plan view. The first light blocking linear pattern BL-1 is thickly formed and has a shape similar to that of a bank in a schematic cross-sectional view, so it is hereinafter referred to as a bank portion.

The second blocking linear pattern BL-2 extends in a direction parallel to the first blocking linear pattern BL-1, and a width thereof in the direction perpendicular to the extension direction in a plan view is thinner than that of the first blocking linear pattern BL-1, and referring to FIG. 3, it overlaps each of the light emitting layers EMLr, EMLg, and EMLb in a plan view, and also overlaps the pixel defining layer 380 in a plan view. The second blocking linear pattern BL-2 is thinner than the first blocking linear pattern BL-1, so it is referred to as a fine linear portion hereinafter.

For example, a portion of the light blocking linear pattern BL that overlaps the light emitting layers EMLr, EMLg, and EMLb may be formed to have a thin width (hereinafter, the width means a width in the direction perpendicular to the extension direction in a plan view) so as not to block light emitted from the light emitting layers EMLr, EMLg, and EMLb as much as possible. Although FIG. 2 to FIG. 4 respectively illustrate that the number of the second light blocking linear patterns BL-2 overlapping one of the light emitting layers EMLr, EMLg, and EMLb is two, the number thereof may be variously changed to be one or more.

An interval between the first blocking linear pattern BL-1 and the second blocking linear pattern BL-2 adjacent to each other is constant. However, in an embodiment, the interval between the light blocking linear patterns BL may not be constant.

In an area in which the light blocking linear patterns BL are not formed, the upper transparent organic layer TOL is positioned together with color converting layers QDr and QDg or a transparent scattering layer TL. The upper transparent organic layer TOL is positioned on the color converting layers QDr and QDg or the transparent scattering layer TL, and in FIG. 2 and FIG. 3, the upper transparent organic layer TOL is illustrated to be positioned between the light blocking linear patterns BL. However, referring to FIG. 4, it can be confirmed that the color converting layers QDr and QDg, the transparent scattering layer TL, and the upper transparent organic layer TOL are formed between the light blocking linear patterns BL. For example, referring to FIG. 4, the color converting layers QDr and QDg or the transparent scattering layer TL are positioned under the upper transparent organic layer TOL. The color converting layers QDr and QDg or the transparent scattering layer TL are covered by the upper transparent organic layer TOL, and thus may not be exposed on the front surface. The color converting layer QDr and QDg or the transparent scattering layer TL may have a height of about 15% or more and about 85% or less of a height of the light blocking linear pattern BL, and the remaining height of the light blocking linear pattern BL may be filled with the upper transparent organic layer TOL.

In an embodiment, an upper transparent inorganic layer may be positioned on the upper transparent organic layer TOL. The upper transparent inorganic layer may be positioned in an area in which the light blocking linear pattern BL is not formed, or may be positioned to cover both the light blocking linear pattern BL and the upper transparent organic layer TOL.

An embodiment of a structure in which the light blocking linear patterns BL and the upper transparent organic layer TOL as shown in FIG. 2 are disposed on an upper portion of the light emitting diode having the arrangement as shown in FIG. 1 is shown in FIG. 3.

In an embodiment of FIG. 3, two second light blocking linear patterns BL-2 are disposed on the front surface of one light emitting diode to have a crossing structure, and one first light blocking linear pattern BL-1 is provided (or disposed) at both sides of the light emitting diode and between adjacent light emitting diodes. For example, the light emitting layers EMLr, EMLg, and EMLb and/or the openings OPr, OPg, and OPb of the pixel defining layer 380 according to an embodiment overlap the two second light blocking linear pattern BL-2, and the first blocking linear pattern BL-1 overlapping only the pixel defining layer 380 is also formed, and the first blocking linear pattern BL-1 and the second blocking linear pattern BL-2 are disposed at equal intervals.

Hereinafter, the cross-sectional structure will be described in detail with reference to FIG. 4.

In the cross-sectional structure of FIG. 4, a structure positioned under an anode (Anode) is omitted, and the structure under the anode (Anode) will be described with reference to FIG. 13 and FIG. 14.

Each light emitting diode may include an electrically isolated anode (Anode).

The pixel defining layer 380 covering at least a portion of the anode (Anode) while having the openings OPr, OPg, and OPb exposing the anode (Anode) may be positioned on the anode (Anode). The pixel defining layer 380 may be a black pixel defining layer that is formed of an organic material displaying a black color so that light applied from the outside is not reflected back to the outside. In an embodiment, the pixel defining layer 380 may include an organic material of a negative type of black color, and may include a black color pigment.

The light emitting layers EMLr, EMLg, and EMLb are respectively positioned on the anode (Anode) exposed by the pixel defining layer 380. The light emitting layers EMLr, EMLg, and EMLb may respectively emit light of a same blue wavelength, and in embodiments, at least some or a number of adjacent light emitting layers EMLr, EMLg, and EMLb may be connected to each other.

A cathode may be positioned on the pixel defining layer 380 and the light emitting layers EMLr, EMLg, and EMLb. In FIG. 4, only the light emitting layer EMLg is briefly illustrated, and a cathode capable of being positioned thereon and thereunder is omitted.

A functional layer may be positioned between the anode (Anode) and each of the light emitting layers EMLr, EMLg, and EMLb and between each of the light emitting layers EMLr, EMLg, and EMLb and the cathode; the functional layer FL may include at least one of auxiliary layers such as an electron injection layer, an electron transporting layer, a hole transporting layer, and a hole injection layer; the hole injection layer and the hole transporting layer may be positioned under the light emitting layer EML; and the electron transporting layer and the electron injection layer may be positioned on the light emitting layer EML.

A spacer may be positioned on the pixel defining layer 380, and the spacer may be covered by the cathode.

An encapsulation layer 400 is positioned on the cathode. The encapsulation layer 400 may include at least one inorganic layer and at least one organic layer, and in an embodiment, it may have a triple-layered structure including a first inorganic encapsulation layer, an organic encapsulation layer, and a second inorganic encapsulation layer. The encapsulation layer 400 may be for protecting the light emitting layers EMLr, EMLg, and EMLb from moisture or oxygen that may be introduced from the outside. In an embodiment, the encapsulation layer 400 may have a structure in which an inorganic layer and an organic layer may be sequentially further stacked each other.

A light control layer including the light blocking linear patterns BL, the color converting layers QDr and QDg, the transparent scattering layer TL, and the upper transparent organic layer TOL is positioned on the encapsulation layer 400.

The light control layer basically may include the light blocking linear patterns BL to control a viewing angle by preventing light emitted from the light emitting layers EMLr, EMLg, and EMLb from being provided at a selectable angle or more. Since light is absorbed by the light blocking linear patterns BL such that luminance is decreased, in an embodiment, the light control layer may additionally include color converting layers QDr and QDg and/or the transparent scattering layer TL. As a result, light is scattered in various directions through the color converting layers QDr and QDg and the transparent scattering layer TL, and is not absorbed in the light blocking linear patterns BL, but is transmitted in the front direction, so that by increasing the light that may be emitted without being absorbed, the front luminance is improved.

For example, the structure of the light control layer is as follows.

The first light blocking linear pattern BL-1 of the light blocking linear patterns BL extends in one direction or a direction, is formed at a position that overlaps only the pixel defining layer 380 in a plan view, and does not overlap the openings OPr, OPg, and OPb of the pixel defining layer 380.

On the other hand, the second light blocking linear pattern BL-2 extends in one direction or a direction parallel to the first light blocking linear pattern BL-1, has a smaller width than that of the first light blocking linear pattern BL-1, and overlaps the openings OPr, OPg, and OPb of the pixel defining layer 380 in a plan view.

An interval between the first light blocking linear pattern BL-1 and/or the second light blocking linear pattern BL-2 adjacent to each other may be constant.

The first light blocking linear pattern BL-1 and the second light blocking linear pattern BL-2 may be made of a material capable of blocking light, and may be made of a same material as a light blocking member 220 used in the light emitting display device. The light blocking linear pattern BL may be made of an organic material including a black color pigment.

The first light blocking linear pattern BL-1 and the second light blocking linear pattern BL-2 are shown to have a columnar shape and to have a constant width, but in an embodiment, the widths thereof may be varied depending on heights thereof, and widths of middle portions thereof may be thick, or widths of upper or lower portions thereof may be thick.

In an embodiment, a concave portion having a concave shape may be provided on the upper portion of the light blocking linear pattern BL. The concave portion may be positioned at a central portion of the upper surface of the light blocking linear pattern BL, and may have a structure extending long along an extending direction of the light blocking linear pattern BL. However, in an embodiment, the concave portion may not extend, and concave portions may be formed on the upper surface of one light blocking linear pattern BL.

The first light blocking linear pattern BL-1 and the second light blocking linear pattern BL-2 may have a same height as the upper surface of the upper transparent organic layer TOL, and may have slightly different heights according to embodiments. In case that a step is positioned between the upper surfaces of the first light blocking linear pattern BL-1, the second light blocking linear pattern BL-2, and the upper transparent organic layer TOL, in order to remove the step, an additional insulating layer may be formed to cover the first light blocking linear pattern BL-1, the second light blocking linear pattern BL-2, and the upper transparent organic layer (TOL).

The color converting layers QDr and QDg, the transparent scattering layer TL, and the upper transparent organic layer TOL are formed between the light blocking linear patterns BL described above.

The red color converting layer QDr is positioned on the first light emitting layer EMLr and between the first light blocking linear pattern BL-1 and the second light blocking linear pattern BL-2, and the upper transparent organic layer TOL is positioned on the red color converting layer QDr. Here, the red color converting layer QDr serves to convert blue light emitted from the first light emitting layer EMLr into red light.

Some or a number of the heights of the first light blocking linear pattern BL-1 and the second light blocking linear pattern BL-2 may correspond to the height of the red color converting layer QDr, and the remaining height of the first light blocking linear pattern BL-1 and the second light blocking linear pattern BL-2 may correspond to the height of the upper transparent organic layer TOL. Since the upper transparent organic layer TOL is positioned at the upper portion, the red color converting layer QDr may not be exposed from the front side. In an embodiment of FIG. 4, the height of the red color converting layer QDr is ⅓ of the height of the first blocking linear pattern BL-1 and the second blocking linear pattern BL-2, and the height of the upper transparent organic layer TOL is ⅔ of the height of the first blocking linear pattern BL-1 and the second blocking linear pattern BL-2. In an embodiment, the height of the red color converting layer QDr and the height of the upper transparent organic layer TOL may vary. In an embodiment, an organic layer made of a same organic material as the upper transparent organic layer TOL may be additionally positioned under the red color converting layer QDr.

The green color converting layer QDg is positioned on the second light emitting layer EMLg and between the first light blocking linear pattern BL-1 and the second light blocking linear pattern BL-2, and the upper transparent organic layer TOL is positioned on the green color converting layer QDg. Here, the green color converting layer QDg serves to convert blue light emitted from the second light emitting layer EMLg into green light.

Some or a number of the heights of the first light blocking linear pattern BL-1 and the second light blocking linear pattern BL-2 may correspond to the height of the green color converting layer QDg, and the remaining height of the first light blocking linear pattern BL-1 and the second light blocking linear pattern BL-2 may correspond to the height of the upper transparent organic layer TOL. Since the upper transparent organic layer TOL is positioned at the upper portion, the green color converting layer QDg may not be exposed from the front side. In an embodiment of FIG. 4, the height of the green color converting layer QDg is ⅓ of the height of the first blocking linear pattern BL-1 and the second blocking linear pattern BL-2, and the height of the upper transparent organic layer TOL is ⅔ of the height of the first blocking linear pattern BL-1 and the second blocking linear pattern BL-2. In an embodiment, the height of the green color converting layer QDg and the height of the upper transparent organic layer TOL may vary. In an embodiment, an organic layer made of a same organic material as the upper transparent organic layer TOL may be additionally positioned under the green color converting layer QDg.

The transparent scattering layer TL is positioned on the third light emitting layer EMLb and between the first light blocking linear pattern BL-1 and the second light blocking linear pattern BL-2, and the upper transparent organic layer TOL is positioned on the transparent scattering layer TL. Here, the transparent scattering layer TL serves to scatter blue light emitted from the third light emitting layer EMLb, and a wavelength of the light may not be changed.

Some or a number of the heights of the first light blocking linear pattern BL-1 and the second light blocking linear pattern BL-2 may correspond to the height of the transparent scattering layer TL, and the remaining height of the first light blocking linear pattern BL-1 and the second light blocking linear pattern BL-2 may correspond to the height of the upper transparent organic layer TOL. Since the upper transparent organic layer TOL is positioned at the upper portion, the transparent scattering layer TL may not be exposed from the front side. In an embodiment of FIG. 4, the height of the transparent scattering layer TL is ⅓ of the height of the first blocking linear pattern BL-1 and the second blocking linear pattern BL-2, and the height of the upper transparent organic layer TOL is ⅔ of the height of the first blocking linear pattern BL-1 and the second blocking linear pattern BL-2. In an embodiment, the height of the transparent scattering layer TL and the height of the upper transparent organic layer TOL may vary. In an embodiment, an organic layer made of a same organic material as the upper transparent organic layer TOL may be additionally positioned under the transparent scattering layer TL.

The light blocking member 220 and color filters 230r, 230g, and 230b are formed on the light control layer as described above.

The light blocking member 220 may be formed to overlap the pixel defining layer 380 in a plan view, and may cover all of the first light blocking linear pattern BL-1. A portion of the light blocking member 220 may partially cover the second light blocking linear pattern BL-2.

The light blocking member 220 has openings OPBM, and the color filter 230r, 230g, or 230b is formed in each opening.

The openings OPBM of the light blocking member 220 correspond to the openings OPr, OPg, and OPb of the pixel defining layer 380, and are formed at positions respectively overlapping the light emitting layers EMLr, EMLg, and EMLb in a plan view.

The red color filter 230r is positioned on the first light emitting layer EMLr and on the red color converting layer QDr, the green color filter 230g is positioned on the second light emitting layer EMLg and on the green color converting layer QDg, and the blue color filter 230b is positioned on the third light emitting layer EMLb and on the transparent scattering layer TL.

In an embodiment of FIG. 4, light emitted from each of the light emitting layers EMLr, EMLg, and EMLb passes through the color converting layer QDr and QDg or the transparent scattering layer (TL), and sequentially passes through the upper transparent organic layer TOL and the color filters 230r and 230g, and 230b to be emitted to the outside of the display device. The refractive index of the color converting layers QDr and QDg and the transparent scattering layer TL is about 1.7, the refractive index of the upper transparent organic layer TOL is about 1.4, and the refractive index of the color filters 230r, 230g, and 230b is about 1.7. Accordingly, light emitted from each of the light emitting layers EMLr, EMLg, and EMLb passes through the color converting layer QDr and QDg or the transparent scattering layer TL having a high refractive index, and passes through the upper transparent organic layer TOL having a low refractive index, and passes through the color filters 230r, 230g, and 230b of a high refractive index. As described above, the light is further curved in the front direction and emitted while sequentially passing through the high refractive index layer, the low refractive index layer, and the high refractive index layer. As a result, the light may be emitted to the front instead of being absorbed by the first light blocking linear pattern BL-1 and the second light blocking linear pattern BL-2, and thus the front luminance may be improved.

In an embodiment, a sensing electrode capable of sensing a touch may be further included between the encapsulation layer 400 and the light control layer.

An insulating layer may be further positioned between the light control layer, and the light blocking member 220 and the color filters 230r, 230g, and 230b positioned thereon. The insulating layer may be positioned as an inorganic insulating layer or an organic insulating layer, and may serve to remove a step of the light control layer.

Figure 5:
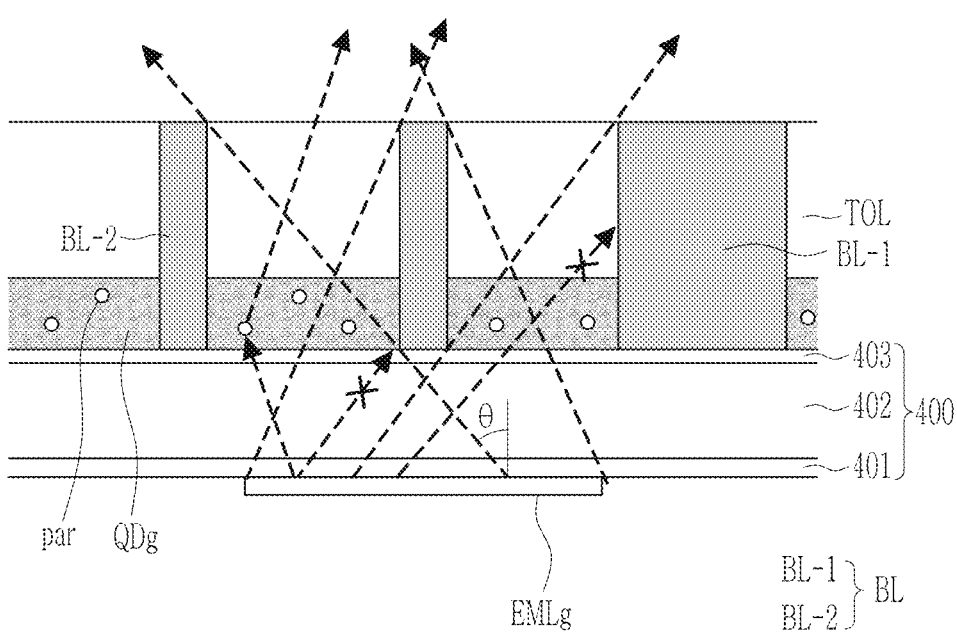
FIG. 5 illustrates a diagram of transmitting and blocking light in a light emitting display device according to an embodiment.

Hereinafter, a light path provided by the light control layer of an embodiment of FIG. 4 is schematically illustrated in FIG. 5, and features of an embodiment will be described with reference to FIG. 5.

FIG. 5 illustrates a diagram of transmitting and blocking light in a light emitting display device according to an embodiment.

In FIG. 5, only the light emitting layer EMLg is briefly illustrated, and an anode and a cathode capable of being positioned thereon and thereunder are omitted. The encapsulation layer 400 is positioned on the light emitting layer EMLg, and the encapsulation layer 400 may include a lower inorganic encapsulation layer 401, an organic encapsulation layer 402, and an upper inorganic encapsulation layer 403.

That the light emitting diode emits light corresponds to that the light emitting layer EMLg emits light, and the light emitted from the light emitting layer EMLg may be emitted in various directions. However, due to the light blocking linear pattern BL positioned on the light emitting layer EMLg, light is not transmitted at an angle of greater than a certain or given angle θ (hereinafter referred to as a viewing angle) with respect to the normal line. As a result, the viewing angle of the light emitting display device is limited. As shown in FIG. 5, quantum dots are included in the form of particles in the green color converting layer QDg, and due to the particles (par) of the quantum dots, light emitted from the light emitting layer EMLg is reflected or scattered at various angles. As shown in FIG. 5, some of the reflected or scattered light is not blocked in the light blocking linear pattern BL and is emitted to the front. As a result, the luminance at the front is improved. In case that the green color converting layer QDg is positioned at a certain or given height or more based on the height of the light blocking linear pattern BL, since the angle of the light reflected from the quantum dot particle (par) may be greater than the viewing angle θ, the green color converting layer may not be able to block the path of light. Therefore, in an embodiment, the upper transparent organic layer TOL is disposed on the green color converting layer QDg and formed to have a certain or given thickness or more, so that in case that an angle of light refracted by the green color converting layer QDg is greater than the viewing angle θ, the thickness thereof may be adjusted so that the light is blocked in the light blocking linear pattern BL.

The viewing angle θ of the light emitting display device may be set depending on the distance between the light blocking linear pattern BL and the light emitting layer EMLg, the interval between adjacent light blocking linear patterns BL, and the width and height of the light blocking linear pattern BL.

In an embodiment, the height of the light blocking linear pattern BL may be formed to be about 20 μm or more and about 50 μm or less, and in an embodiment, the height thereof is formed to be about 23 μm. The width of the second light blocking linear pattern BL-2 may be about 1 μm or more and about 3 μm or less, and in an embodiment, it is formed to be about 2 μm. For example, in order to prevent light from being provided at a selectable angle θ or more with respect to the normal line, the light blocking linear pattern BL is formed to be higher than the width thereof, and a ratio of the height to the width may be about 16 or more and about 20 or less.

An interval between the light blocking linear patterns BL may be determined based on an angle at which light is provided. For example, in case that it is required that the height of the light blocking linear pattern BL is about 23 μm and the maximum angle θ through which light is transmitted is about 30 degrees, the interval between the light blocking linear patterns BL may be determined based on a trigonometric function. Here, the interval between adjacent light blocking linear patterns BL may have a smaller value than the height of the light blocking linear pattern BL, and may have a value of about 11 μm or more and about 29 μm or less.

As the distance between the light blocking linear patterns BL decreases, the viewing angle θ to be blocked is decreased, so the blocking effect is increased, but transmittance may be reduced. Therefore, it is necessary to consider the transmittance and the blocked viewing angle θ together, and in an embodiment, the transmittance may be set to about 80% and the blocked viewing angle θ may be set to about 30 degrees. On the other hand, in an embodiment in which the transmittance may be further reduced, the blocked viewing angle θ may be reduced to about 15 degrees. In an embodiment in which the transmittance must be high or the blocked viewing angle θ may be greater than about 30 degrees, it is possible to set light to not proceed at various angles, and the blocked viewing angle θ may be set to an angle of about 45 degrees.

As described above, an embodiment in which the light blocking linear pattern BL is formed in the light emitting display device is different from a comparative example in which a viewing angle is reduced by attaching a film to a front surface of a light emitting display device in the following respects.

In case that the film is attached, misalignment may occur, and in case that the film is incorrectly attached, the moiré phenomenon may occur, but in an embodiment, there is no misalignment, and the moiré may be readily removed by adjusting the interval between the light blocking linear patterns BL.

In the comparative example in which the film is attached, the manufacturing cost is increased, and the transmittance is reduced due to light loss occurring at the interface due to the adhesive or the like during attachment.

In an embodiment, the color converting layers QDr and QDg or the transparent scattering layer TL may be additionally formed in addition to the upper transparent organic layer TOL between the light blocking linear patterns BL, so that before some light is incident on and absorbed by the light blocking linear pattern BL, by refracting or dispersing the light, it is possible to emit some of the light to the front. As a result, the luminance at the front may be improved.

Referring to FIG. 3 and FIG. 4, the second light blocking linear pattern BL-2 of the light blocking linear patterns BL overlaps the light emitting diode or the light emitting layers EMLr, EMLg, and EMLb, and the first light blocking linear pattern BL-1 overlaps only the pixel defining layer 380 and the light blocking member 220.

In an embodiment of FIG. 3 and FIG. 4, the number and positions of the second light blocking linear patterns BL-2 respectively overlapping the light emitting layers EMLr, EMLg, and EMLb may be varied.

Hereinafter, modified structures of the light control layer and the light blocking member and color filter positioned thereon will be described with reference to FIG. 6 to FIG. 9.

FIG. 6 to FIG. 9 illustrate schematic cross-sectional views of a light emitting display device according to an embodiment.

An embodiment of changing the height of the color converting layers QDr and QDg or the transparent scattering layer TL and the upper transparent organic layer TOL in the light control layer will be described with reference to FIG. 6 and FIG. 7.

In an embodiment of FIG. 4 discussed above, the height of the red color converting layer QDr, the green color converting layer QDg, and the transparent scattering layer TL is ⅓ of the height of the first blocking linear pattern BL-1 and the second blocking linear pattern BL-2, and the height of the upper transparent organic layer TOL is ⅔ of the height of the first blocking linear pattern BL-1 and the second blocking linear pattern BL-2. However, the color converting layers QDr and QDg or the transparent scattering layer TL may have a height of about 15% or more and about 85% or less of the height of the light blocking linear pattern BL, and in FIG. 6, the color converting layers QDr and QDg or the transparent scattering layer TL having a height that is ½ of the height of the first light blocking linear pattern BL-1 and the second light blocking linear pattern BL-2 are shown. The height of the upper transparent organic layer TOL is ½ of the height of the first light blocking linear pattern BL-1 and the second light blocking linear pattern BL-2.

Figure 7:
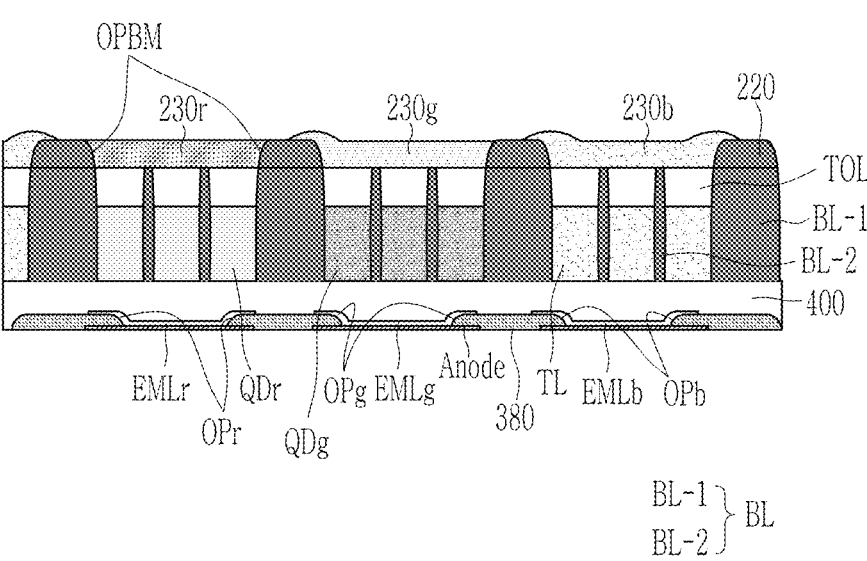

In FIG. 7, the height of the color converting layers QDr and QDg or the transparent scattering layer TL is ⅔ of the height of the first blocking linear pattern BL-1 and the second blocking linear pattern BL-2, and the height of the upper transparent organic layer TOL is ⅓ of the height of the first blocking linear pattern BL-1 and the second blocking linear pattern BL-2.

Figure 6:
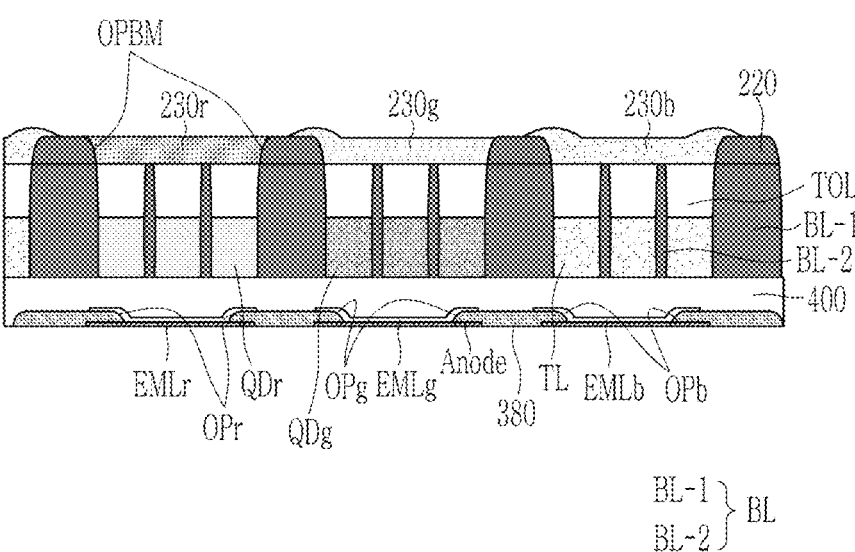
FIG. 6 to FIG. 9 illustrate schematic cross-sectional views of a light emitting display device according to an embodiment.

As shown in FIG. 4, FIG. 6, and FIG. 7, as the height of the color converting layers QDr and QDg or the transparent scattering layer TL increases, the viewing angle θ may become wider again by the first light blocking linear pattern BL-1 and the second light blocking linear pattern BL-2. This is because the viewing angle θ is widened as the proceeding direction of light is changed due to the particles included in the color converting layers QDr and QDg or the transparent scattering layer TL, and thus it is required that the first light blocking linear pattern BL-1 and the second light blocking linear pattern BL-2 protrude by at least a selectable height from the upper surface of the color converting layers QDr and QDg or the transparent scattering layer TL. For example, the height corresponding to the upper transparent organic layer TOL among the first light blocking linear pattern BL-1 and the second light blocking linear pattern BL-2 may need to be greater than or equal to a selectable height. Here, a height protruding from the upper surface of the color converting layers QDr and QDg or the transparent scattering layer TL among the first light blocking linear pattern BL-1 and the second light blocking linear pattern BL-2 is proportional to the interval between the first light blocking linear pattern BL-1 and the second light blocking linear pattern BL-2. For example, in case that the interval between the first blocking linear pattern BL-1 and the second blocking linear pattern BL-2 is narrow, the selectable height protruding from the upper surface of the color converting layers QDr and QDg or the transparent scattering layer TL among the first light blocking linear pattern BL-1 and the second light blocking linear pattern BL-2 may also be low. In contrast, in case that the interval between the first blocking linear pattern BL-1 and the second blocking linear pattern BL-2 is wide, the selectable height protruding from the upper surface of the color converting layers QDr and QDg or the transparent scattering layer TL among the first light blocking linear pattern BL-1 and the second light blocking linear pattern BL-2 may also be high.

On the other hand, since the height of the color converting layers QDr and QDg should change a wavelength for all of incident light, a minimum thickness may be required, and respective colors may have different heights. Therefore, in an embodiment, the height of the color converting layers QDr and QDg or the transparent scattering layer TL may be differently formed for respective colors.

As shown in FIG. 7, in an embodiment in which the height of the color converting layers QDr and QDg or the transparent scattering layer TL is ⅔ of the height of the first light blocking linear pattern BL-1 and the second light blocking linear pattern BL-2, in order to limit the viewing angle θ, it may be necessary to further form an additional linear pattern on the light control layer. This structure will be described with reference to FIG. 8.

Figure 8:
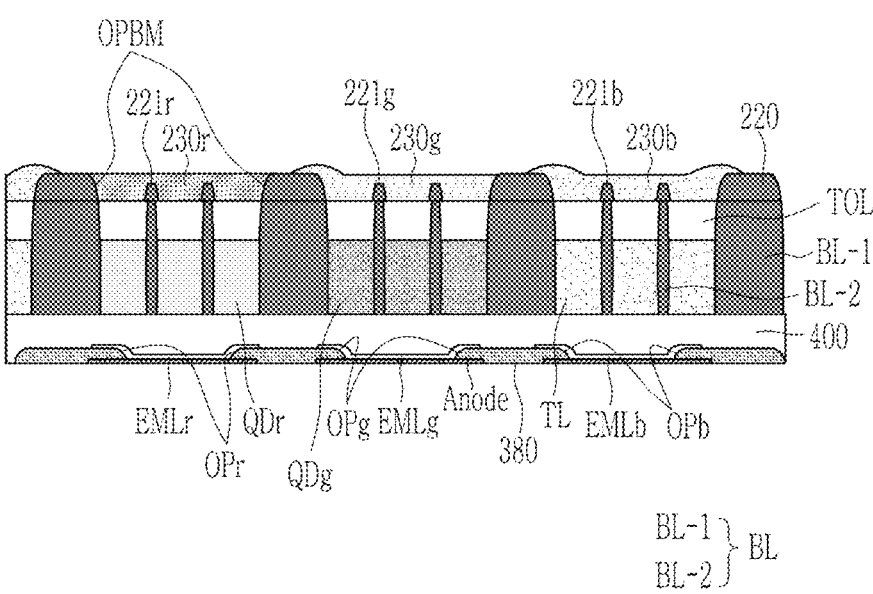

In FIG. 8, unlike FIG. 7, additional light blocking linear patterns 221*r*, 221*g*, and 221*b* are further formed with a same material or a similar material as the light blocking member 220 on the light control layer and at a position overlapping the second light blocking linear pattern BL-2 in a plan view.

For example, the light blocking member 220, the additional light blocking linear patterns 221*r*, 221*g*, and 221*b*, and the color filter 230*r*, 230*g*, and 230*b* are positioned on the light blocking linear pattern BL and the upper transparent organic layer TOL.

The light blocking member 220 may be formed at a position overlapping the pixel defining layer 380 in a plan view, and the openings OPBM of the light blocking member 220 may be formed at positions overlapping the openings OPr, OPg, and OPb of the pixel defining layer 380 in a plan view. The light blocking member 220 may cover the first light blocking linear pattern BL-1, and a portion of the light blocking member 220 may cover the second light blocking linear pattern BL-2.

The additional light blocking linear patterns 221*r*, 221*g*, and 221*b* are positioned within the openings OPBM of the light blocking member 220, and are disposed at a position overlapping a portion of the second light blocking linear pattern BL-2 in a plan view. The additional light blocking linear patterns 221*r*, 221*g*, and 221*b* extend in one direction or a direction like the second light blocking linear pattern BL-2 within the openings OPBM of the light blocking member 220. In a schematic cross-sectional view, the additional light blocking linear patterns 221*r*, 221*g*, and 221*b* may be positioned only at positions overlapping the second light blocking linear pattern BL-2.

The additional light-blocking linear patterns 221*r*, 221*g*, and 221*b* are made of a same material or a similar material as the light blocking member 220, so that among light emitted from the light emitting layers EMLr, EMLg, and EMLb, by blocking light proceeding at an angle of greater than the viewing angle θ with respect to the normal line among light passing through the upper transparent organic layer TOL, the viewing angle θ of the display device may be maintained at a selectable angle or less. For example, the additional light blocking linear patterns 221*r*, 221*g*, and 221*b* of an embodiment of FIG. 8 may be additional configurations designed so that the viewing angle θ is not increased by the light reflected or refracted by the particles positioned in the color converting layers QDr and QDg and the transparent scattering layer TL.

The color converting layers QDr and QDg and the transparent scattering layer TL may not be positioned between the light blocking linear patterns BL but may be positioned below the light blocking linear pattern BL, which will be described with reference to FIG. 9.

Figure 9:
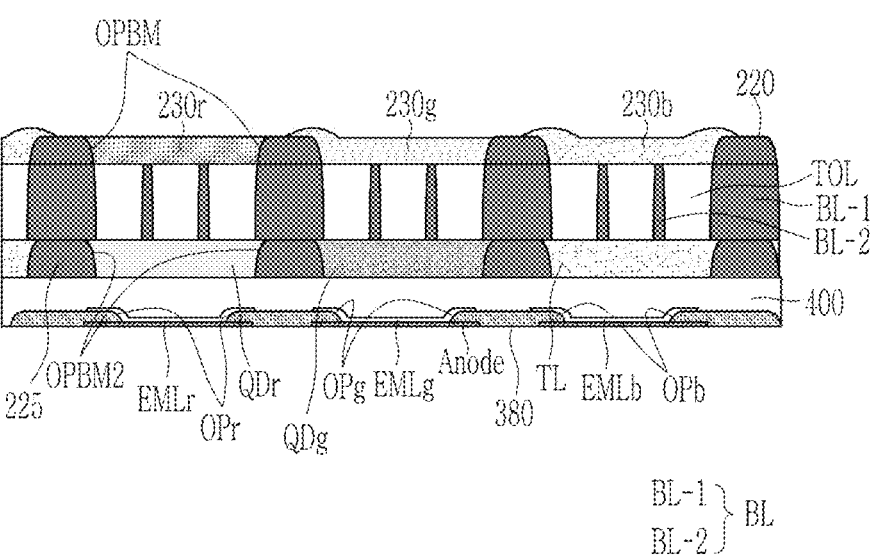

Referring to FIG. 9, an additional light blocking member 225, the color converting layers QDr and QDg, and the transparent scattering layer TL are positioned on the encapsulation layer 400.

The additional light blocking member 225 has openings OPBM2 at positions overlapping the openings OPr, OPg, and OPb of the pixel defining layer 380 in a plan view, and the color converting layers QDr and QDg and/or the transparent scattering layer TL are positioned within the openings OPBM2. By way of example, the red color converting layer QDr is positioned on the first light emitting layer EMLr and in the opening OPBM2, the green color converting layer QDg is positioned on the second light emitting layer EMLg and in the opening OPBM2, and the transparent scattering layer TL is positioned on the third light emitting layer EMLb and in the opening OPBM2.

The light control layer is positioned on the additional light blocking member 225, the color converting layers QDr and QDg, and the transparent scattering layer TL, and the structure of the light control layer of FIG. 9 does not include the color converting layers QDr and QDg and the transparent scattering layer TL as described below.

The first blocking linear pattern BL-1 and the second blocking linear pattern BL-2 of the light blocking linear patterns BL extend in one direction or a direction. The first light blocking linear pattern BL-1 is formed at a position overlapping only the pixel defining layer 380 in a plan view, and does not overlap the openings OPr, OPg, and OPb of the pixel defining layer 380. The second light blocking linear pattern BL-2 overlaps the openings (OPr, OPg, and OPb) of the pixel defining layer 380 in a plan view. The interval between the first light blocking linear pattern BL-1 and/or the second light blocking linear pattern BL-2 adjacent to each other may be constant.

The first light blocking linear pattern BL-1 and the second light blocking linear pattern BL-2 may be made of a material capable of blocking light, and may be made of a same material or a similar material as the light blocking member 220 used in the light emitting display device. The light blocking linear pattern BL may be made of an organic material including a black color pigment. The first light blocking linear pattern BL-1 and the second light blocking linear pattern BL-2 are shown to have a columnar shape and to have a constant width, but in an embodiment, the widths thereof may be varied depending on heights thereof, and widths of middle portions thereof may be thick, or widths of upper or lower portions thereof may be thick.

The upper transparent organic layer TOL is positioned between the first light blocking linear pattern BL-1 and the second light blocking linear pattern BL-2, and the color converting layers QDr and QDg and the transparent scattering layer TL are not included.

The light blocking member 220 having the openings OPBM overlapping the openings OPr, OPg, and OPb of the pixel defining layer 380 is positioned on the light control layer, and the color filters 230*r*, 230*g*, and 230*b* are positioned in the openings OPBM.

Even in an embodiment of FIG. 9, the viewing angle θ of the display device may be maintained at a selectable angle or less by the first light blocking linear pattern BL-1 and the second light blocking linear pattern BL-2, and due to the particles of the color converting layers QDr and QDg and the transparent scattering layer TL, light may be refracted and/or dispersed to increase luminance in front.

FIG. 9 illustrates that the light control layer, the additional light blocking member 225, the color converting layers QDr and QDg, and the transparent scattering layer TL are in direct contact, but in an embodiment, an insulating layer is provided under the light control layer, so that it is possible to remove a step occurring in the additional light blocking member 225, the color converting layers QDr and QDg, and the transparent scattering layer TL.

Various modified structures may be provided as described above, and an effect that may be obtained in case that the light emitting display device including the light blocking linear pattern BL is applied to a vehicle will be compared with the comparative example of FIG. 10 and will be described with reference to FIG. 11.

Figure 10:
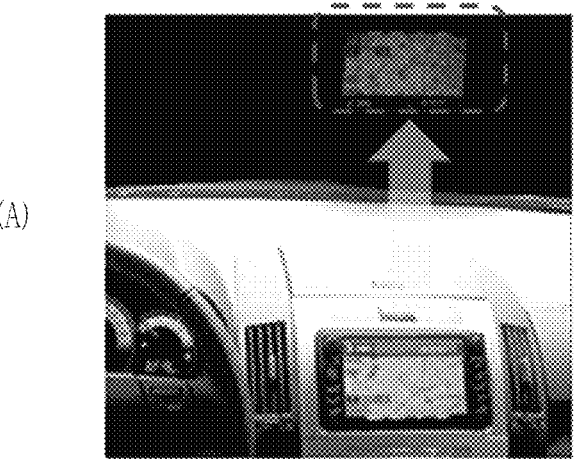
FIG. 10 illustrates a case in which a light emitting display device according to a comparative example is applied to a vehicle.
Figure 10:
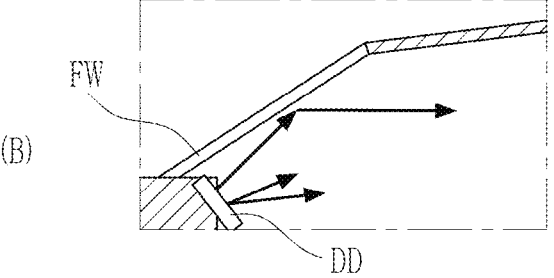
Figure 11:
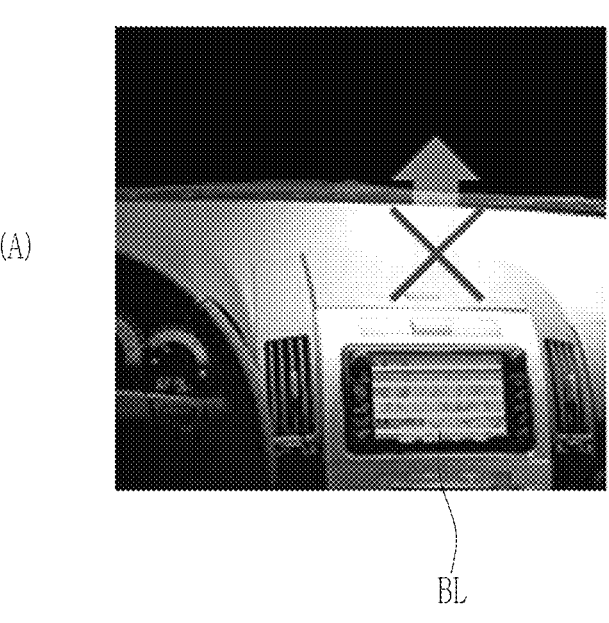
FIG. 11 illustrates a case in which a light emitting display device according to an embodiment is applied to a vehicle.
Figure 11:
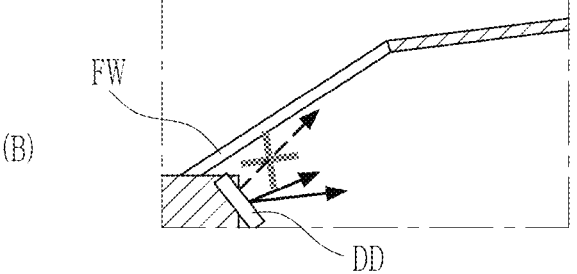

FIG. 10 illustrates a case in which a light emitting display device according to a comparative example is applied to a vehicle, and FIG. 11 illustrates a case in which a light emitting display device according to an embodiment is applied to a vehicle.

In the comparative example of FIG. 10, since a light emitting display device DD used in a vehicle does not include the light blocking linear pattern BL, as shown in FIG. 10 (B), an angle of the emitted light is not limited, and the emitted light is emitted in various directions.

In contrast, in an embodiment of FIG. 11, a light emitting display device DD used in a vehicle may include light blocking linear patterns BL arranged (or disposed) in one direction (for example, a horizontal direction) to partially block light emitted in a vertical direction. It is possible to block light of about 30 degrees or more based on a normal line perpendicular to a front surface of the light emitting display device DD.

Referring to FIG. 10, the light emitted from the light emitting display device DD positioned in a center fascia of the vehicle is also provided to the vehicle's windshield FW, and the light emitted from the light emitting display device DD may be reflected by the windshield FW at night to be applied to the driver's eyes, which may cause a problem of obstructing the driver's view.

On the other hand, referring to FIG. 11, the light emitting display device DD used in the vehicle may include the light blocking linear patterns BL, so that the light emitted from the light emitting display device DD is not transmitted to the windshield FW of the vehicle to not be reflected from the windshield FW even at night and thus to not obstruct the driver's view.

In an embodiment, the arrangement direction of the light emitting display device DD and the light blocking linear patterns BL used in the vehicle may be varied, and an embodiment thereof will be described with reference to FIG. 12.

Figure 12:
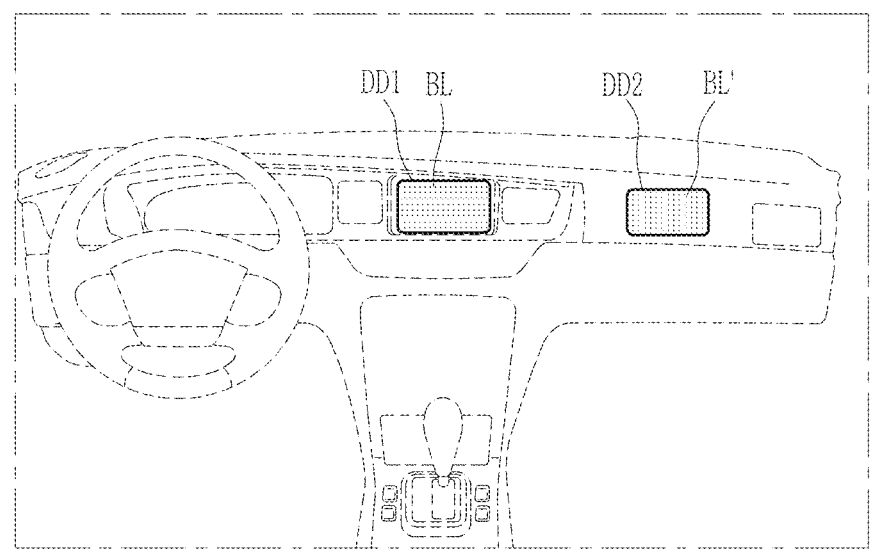
FIG. 12 illustrates a case in which a light emitting display device according to an embodiment is applied to a vehicle.

FIG. 12 illustrates a case in which a light emitting display device according to an embodiment is applied to a vehicle.

Two light emitting display devices DD1 and DD2 are attached to the vehicle according to an embodiment of FIG. 12.

The first light emitting display device DD1 is positioned in the center fascia as shown in FIG. 11, and may include light blocking linear patterns BL arranged in the horizontal direction. As a result, light is not reflected on the windshield to not obstruct the driver's view.

The second light emitting display device DD2 is positioned in front of the passenger seat, and may include light blocking linear patterns BL' arranged in the vertical direction. Due to the light blocking linear patterns BL' arranged in the vertical direction, the light emitted from the second light emitting display device DD2 is not provided in the left and right directions, so that only a person sitting in the passenger seat may see the screen of the second light emitting display device DD2, and the driver may not see the screen of the second light emitting display device DD2. As a result, the driver may concentrate on driving without paying attention to the second light emitting display device DD2 while driving.

In the above, the schematic structure of the light emitting display device and the structure of the light blocking linear pattern BL and of the surroundings thereof have been described in detail.

Hereinafter, a structure of the light emitting diode and the like positioned under the light blocking linear pattern BL will be described in detail with reference to FIG. 13 and FIG. 14.

Figure 13:
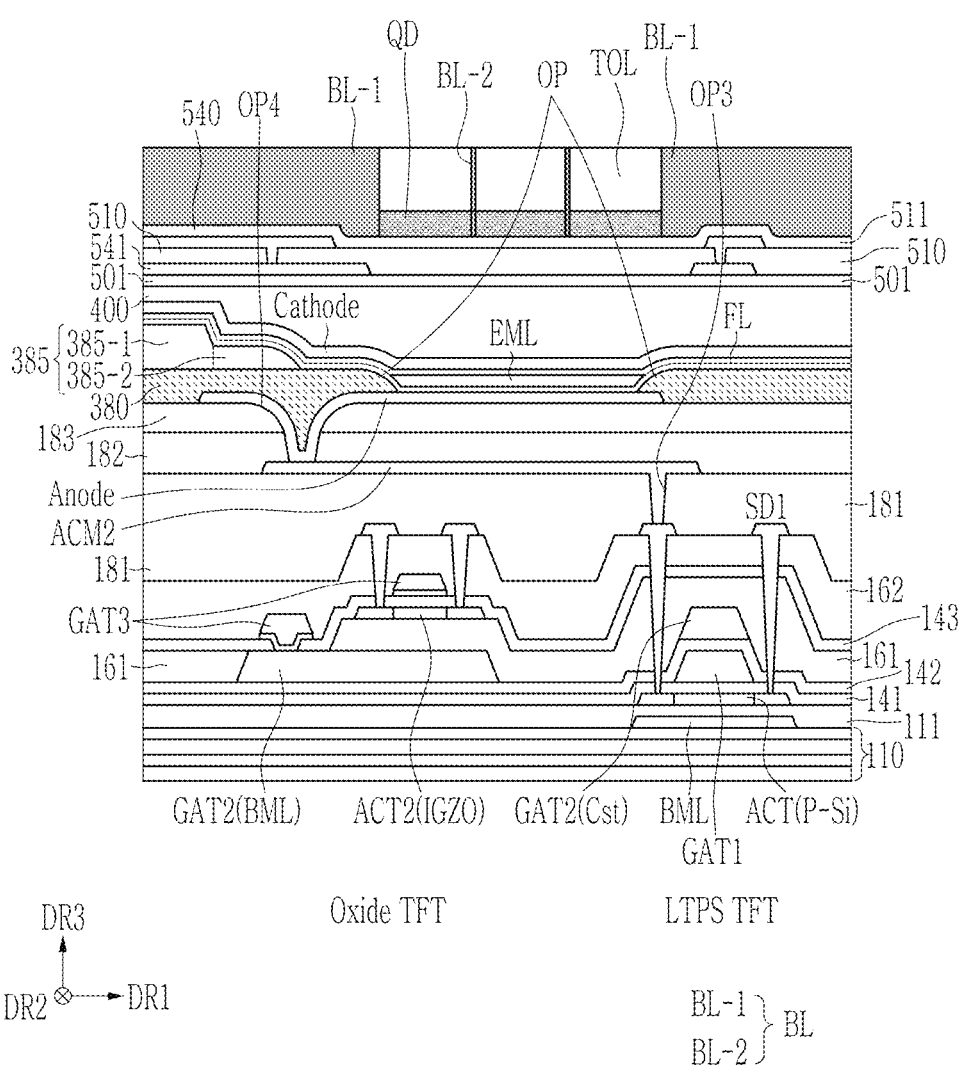
FIG. 13 and FIG. 14 illustrate schematic cross-sectional structures of a light emitting display device according to each embodiment.
Figure 14:
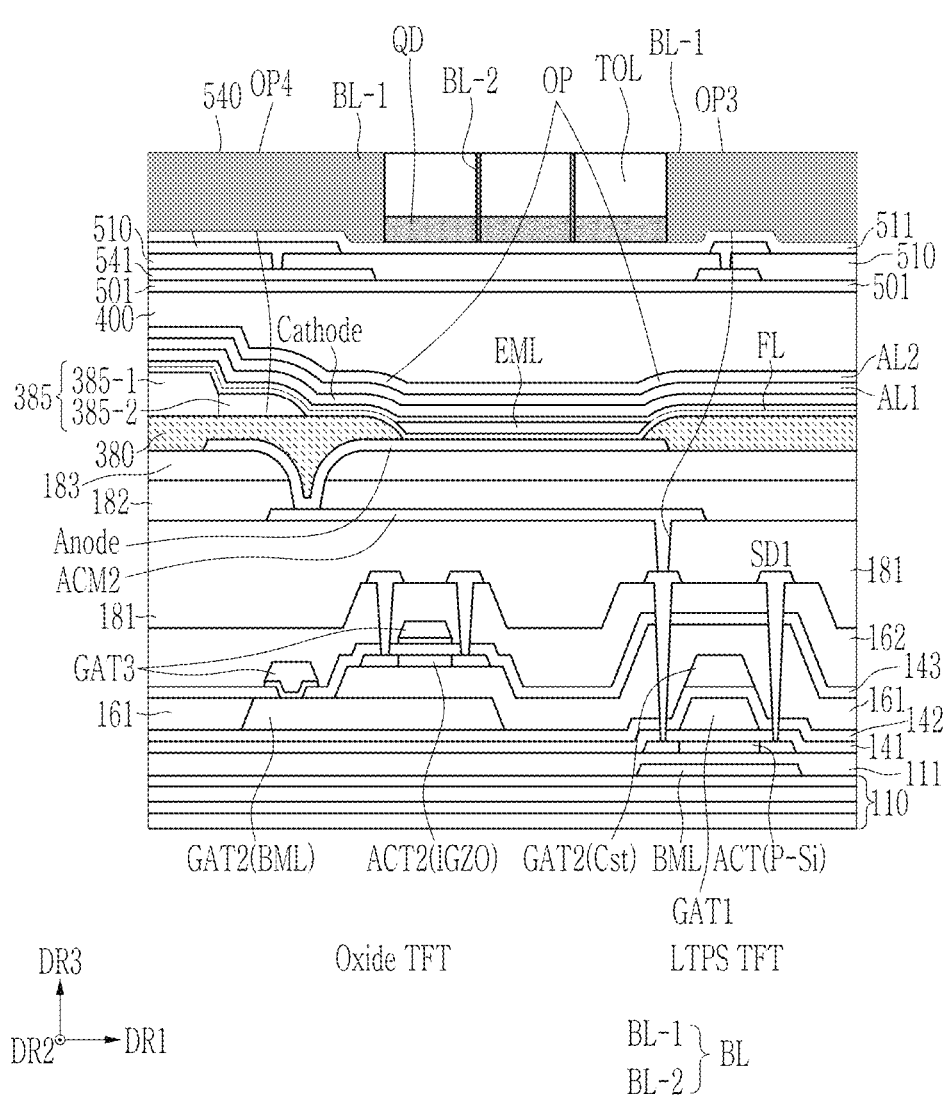

FIG. 13 and FIG. 14 illustrate schematic cross-sectional structures of a light emitting display device according to each embodiment.

FIG. 13 illustrates a stacked structure of a pixel disposed in a display area of a light emitting display device.

The light emitting display device may largely be divided into a lower panel layer and an upper panel layer, and the lower panel layer is a portion in which a light emitting diode and a pixel circuit part forming the pixel are positioned, and the lower panel may also include an encapsulation layer 400 covering them. Here, the pixel circuit part may include a second organic layer 182 and a third organic layer 183 and may mean a configuration thereunder, and the light emitting diode may mean a configuration positioned on the third organic layer 183 and under the encapsulation layer 400. A structure positioned on the encapsulation layer 400 may correspond to the upper panel layer, and the light blocking linear patterns BL are also included in the upper panel layer. In an embodiment, the third organic layer 183 may not be included.

Referring to FIG. 13, a metal layer BML is positioned on a substrate 110.

The substrate 110 may include a material that has a rigid characteristic such as glass and thus is not bent, or may include a flexible material such as plastic or polyimide that may be bent. In a case of a flexible substrate, as shown in FIG. 13, a two-layered structure that has a polyimide and a barrier layer formed of an inorganic insulating material thereon may have a double structure.

The metal layer BML may be formed at a position overlapping a channel of a driving transistor in a plan view among subsequent first semiconductor layers ACT (P—Si), and it is also referred to as a lower shielding layer. The metal layer BML may include a metal such as copper (Cu), molybdenum (Mo), aluminum (Al), and titanium (Ti), or a metal alloy thereof. Here, the driving transistor may mean a transistor that generates a current transmitted to the light emitting diode.

A buffer layer 111 covering the substrate 110 and the metal layer BML is positioned on them. The buffer layer 111 serves to block penetration of impurity elements into a first semiconductor layer ACT (P—Si), and may be an inorganic insulating layer including a silicon oxide ($SiO_x$), a silicon nitride ($SiN_x$), or a silicon oxynitride ($SiO_xN_y$).

A first semiconductor layer ACT (P—Si) formed of a silicon semiconductor (for example, a polycrystalline semiconductor (P—Si)) is positioned on the buffer layer 111. The first semiconductor layer ACT (P—Si) may include a channel of a polycrystalline transistor (LTPS TFT) including a driving transistor, and a first area and a second area positioned at both sides thereof. Here, the polycrystalline transistor (LTPS TFT) may include a driving transistor and various switching transistors. Both sides of the channel of the first semiconductor layer ACT (P—Si) have an area having a conductive layer characteristic by plasma treatment or doping, so that it may serve as a first electrode and a second electrode of a transistor.

A first gate insulating layer 141 may be positioned on the first semiconductor layer ACT (P—Si). The first gate insulating layer 141 may be an inorganic insulating layer including a silicon oxide ($SiO_x$), a silicon nitride ($SiN_x$), or a silicon oxynitride ($SiO_xN_y$).

A first gate conductive layer including a gate electrode GAT1 of the polycrystalline transistor (LTPS TFT) may be positioned on the first gate insulating layer 141. In the first gate conductive layer, a scan line or a light emitting control line may be formed in addition to the gate electrode GAT1 of the polycrystalline transistor (LTPS TFT). The first gate conductive layer may include a metal such as copper (Cu), molybdenum (Mo), aluminum (Al), or titanium (Ti), or a metal alloy thereof, and may be formed as a single layer or a multilayer.

After the first gate conductive layer is formed, a plasma treatment or a doping process may be performed to make the exposed area of the first semiconductor layer conductive. For example, the first semiconductor layer ACT (P—Si) covered by the first gate conductive layer is not conductive, and the portion of the first semiconductor layer ACT (P—Si) that is not covered by the first gate conductive layer may have the same characteristic as the conductive layer.

A second gate insulating layer 142 may be positioned on the first gate conductive layer and the first gate insulating layer 141. The second gate insulating layer 142 may be an inorganic insulating layer including a silicon oxide ($SiO_x$), a silicon nitride ($SiN_x$), or a silicon oxynitride ($SiO_xN_y$).

A second gate conductive layer GAT2 including one electrode GAT2 (Cst) of a storage capacitor Cst and a lower shielding layer GAT2 (BML) of an oxide transistor (Oxide TFT) may be positioned on the second gate insulating layer 142. The lower shielding layer GAT2 (BML) of the oxide transistor (Oxide TFT) is positioned below the channel of the oxide transistor (Oxide TFT), and may serve to shield from light or electromagnetic interference provided to the channel from a lower side thereof. One electrode GAT2 (Cst) of the storage capacitor Cst overlaps the gate electrode GAT1 of the driving transistor to form the storage capacitor Cst. In an embodiment, the second gate conductive layer GAT2 may further include a scan line, a control line, or a voltage line. The second gate conductive layer GAT2 may include a metal such as copper (Cu), molybdenum (Mo), aluminum (Al), or titanium (Ti), or a metal alloy thereof, and may be formed as a single layer or a multilayer.

A first interlayer insulating layer 161 may be positioned on the second gate conductive layer GAT2. The first interlayer insulating layer 161 may include an inorganic insulating layer including a silicon oxide ($SiO_x$), a silicon nitride ($SiN_x$), or a silicon oxynitride ($SiO_xN_y$), and in an embodiment, the inorganic insulating material may be thickly formed therein.

An oxide semiconductor layer ACT2 (IGZO) (also referred to as a second semiconductor layer) including a channel, a first area, and a second area of the oxide transistor (Oxide TFT) may be positioned on the first interlayer insulating layer 161.

A third gate insulating layer 143 may be positioned on the oxide semiconductor layer ACT2 (IGZO). The third gate insulating layer 143 may be positioned on an entire surface of the oxide semiconductor layer ACT2 (IGZO) and the first interlayer insulating layer 161. The third gate insulating layer 143 may include an inorganic insulating layer including a silicon oxide ($SiO_x$), a silicon nitride ($SiN_x$), or a silicon oxynitride ($SiO_xN_y$).

A third gate conductive layer including a gate electrode GAT3 of the oxide transistor (Oxide TFT) may be positioned on the third gate insulating layer 143. The gate electrode GAT3 of the oxide transistor (Oxide TFT) may overlap the channel. The third gate conductive layer may further include a scan line or a control line. The third gate conductive layer may include a metal such as copper (Cu), molybdenum (Mo), aluminum (Al), or titanium (Ti), or a metal alloy thereof, and may be formed as a single layer or a multilayer.

A second interlayer insulating layer 162 may be positioned on the third gate conductive layer. The second interlayer insulating layer 162 may have a single layered or multi-layered structure. The second interlayer insulating layer 162 may include an inorganic insulating material such as a silicon nitride ($SiO_x$), a silicon nitride ($SiN_x$), or a silicon oxynitride ($SiO_xN_y$), and in an embodiment, it may include an organic material.

A first data conductive layer SD1 including a connecting member capable of being connected to the first area and the second area of each of the polycrystalline transistor (LTPS TFT) and the oxide transistor (Oxide TFT) may be positioned on the second interlayer insulating layer 162. The first data conductive layer SD1 may include a metal such as aluminum (Al), copper (Cu), molybdenum (Mo), or titanium (Ti), or a metal alloy thereof, and may be formed as a single layer or a multilayer.

A first organic layer 181 may be positioned on the first data conductive layer SD1. The first organic layer 181 may be an organic insulating layer including an organic material, and the organic material may include one or more of a polyimide, a polyamide, an acryl resin, benzocyclobutene, and a phenol resin.

A second data conductive layer including an anode connecting member ACM2 may be positioned on the first organic layer 181. The second data conductive layer may include a data line or a driving voltage line. The second data conductive layer may include a metal such as aluminum (Al), copper (Cu), molybdenum (Mo), or titanium (Ti), or a metal alloy thereof, and may be formed as a single layer or a multilayer. The anode connecting member ACM2 is connected to the first data conductive layer SD1 through an opening OP3 positioned on the first organic layer 181.

The second organic layer 182 and the third organic layer 183 are positioned on the second data conductive layer, and an opening OP4 for anode connection is formed in the second organic layer 182 and the third organic layer 183. The anode connecting member ACM2 is electrically connected to an anode (Anode) through the opening OP4 for anode connection. The second organic layer 182 and the third organic layer 183 may be an organic insulating layer, and may include one or more of a polyimide, a polyamide, an acryl resin, benzocyclobutene, and a phenol resin. In an embodiment, the third organic layer 183 may be omitted.

A pixel defining layer 380 covering at least a portion of the anode (Anode) while having the opening OP exposing the anode (Anode) may be positioned on the anode (Anode). The pixel defining layer 380 may be a black pixel defining layer that is made of an organic material having a black color so that light applied from the outside is not reflected back to the outside, and in an embodiment, it may be made of a transparent organic material. Therefore, in an embodiment, the pixel defining layer 380 may include an organic material of a negative type black color, and may include a black color pigment.

A spacer 385 is positioned on the pixel defining layer 380. Unlike the pixel defining layer 380, the spacer 385 may be made of a transparent organic insulating material. In an embodiment, the spacer 385 may be made of a positive type of transparent organic material. The spacer 385 may include two portions 385-1 and 385-2 with different heights, and the high height portion 385-1 may serve as a spacer, while the low height portion 385-2 may improve adhesion between the spacer and the pixel defining layer 380.

On the anode (Anode), the spacer 385, and the pixel defining layer 380, a functional layer FL and a cathode (Cathode) are sequentially formed, and the functional layer FL and the cathode (Cathode) may be positioned in the entire area. A light emitting layer EML may be positioned between the functional layers FL, and the light emitting layer EML may be positioned only in an opening OP of the pixel defining layer 380. Hereinafter, a combination of the functional layer FL and the light emitting layer EML may be referred to as an intermediate layer. The functional layer FL may include at least one of auxiliary layers such as an electron injection layer, an electron transport layer, a hole transport layer, and a hole injection layer, and the hole injection layer and the hole transport layer may be positioned at a lower portion of the light emitting layer EML and the electron transport layer and the electron injection layer may be positioned at an upper portion of the light emitting layer EML.

An encapsulation layer 400 is positioned on the cathode (Cathode). The encapsulation layer 400 may include at least one inorganic layer and at least one organic layer, and it may have a triple-layered structure including a first inorganic encapsulation layer, an organic encapsulation layer, and a second inorganic encapsulation layer as in an embodiment of FIG. 4. The encapsulation layer 400 may be for protecting the light emitting layer EML from moisture or oxygen that may be introduced from the outside. In an embodiment, the encapsulation layer 400 may have a structure in which an inorganic layer and an organic layer may be sequentially further stacked each other.

Sensing insulating layers 501, 510, and 511 and sensing electrodes 540 and 541 are positioned on the encapsulation layer 400 for touch sensing. In an embodiment of FIG. 13, a touch may be sensed in a capacitive type by using two sensing electrodes 540 and 541.

For example, the first sensing insulating layer 501 is formed on the encapsulation layer 400, and the sensing electrodes 540 and 541 are formed thereon. The sensing electrodes 540 and 541 may be insulated from each other with the second sensing insulating layer 510 therebetween, and some or a number thereof may be electrically connected through an opening positioned in the sensing insulating layer 510. Here, the sensing electrodes 540 and 541 may include a metal such as aluminum (Al), copper (Cu), silver (Ag), gold (Au), molybdenum (Mo), titanium (Ti), or tantalum (Ta), or a metal alloy thereof, and may be formed as a single layer or a multilayer. The third sensing insulating layer 511 is formed on the sensing electrode 540.

A light control layer is positioned on the third sensing insulating layer 511.

For example, the light blocking linear patterns BL are formed on the third sensing insulating layer 511, and the color converting layer QD and the upper transparent organic layer TOL are positioned between the light blocking linear patterns BL. For example, the color converting layer QD, the first light blocking linear pattern BL-1, and the second light blocking linear pattern BL-2 are positioned on the third sensing insulating layer 511. The upper transparent organic layer TOL is positioned on the color converting layer QD as a portion in which the light blocking linear patterns BL are not positioned.

Referring to FIG. 4, a transparent scattering layer may be positioned between the light blocking linear patterns BL and under the upper transparent organic layer TOL instead of the color converting layer QD, and such a stacked structure may be a stacked structure corresponding to the light emitting diode emitting blue light.

Unlike FIG. 4, although the light blocking member and the color filter are not shown on the light control layer in FIG. 13, in an embodiment, the light blocking member and color filter may be positioned. Unlike FIG. 4, modifications according to embodiments of FIG. 6 to FIG. 8 may be possible.

In an embodiment, a polarizer may be included on the light blocking linear patterns BL. However, in an embodiment in which the pixel defining layer 380 is formed to include a black pigment, a polarizer may not be used.

In FIG. 13, an embodiment in which a total of three organic layers are formed and the anode connecting opening is formed in the second organic layer and the third organic layer has been described. However, at least two organic layers may be formed, and the anode connecting opening may be positioned in the upper organic layer positioned far from the substrate, and the lower organic layer opening may be positioned in the lower organic layer.

FIG. 13 may also form various modified embodiments, one of which will be described with reference to FIG. 14.

In an embodiment of FIG. 14, a material included in the upper transparent organic layer TOL may selectively absorb light of a wavelength of a partial band among light reflected inside the display device or light incident outside the display device. The material (hereinafter, referred to as a reflection adjusting material) that is included in the upper transparent organic layer TOL and may absorb the light of the wavelength of the partial band may have the following characteristics.

The reflection adjusting material absorbs light in a first wavelength range of about 490 nm to about 505 nm and light in a second wavelength range of about 585 nm to about 600 nm, so that it may have light transmittance of about 40% or less in the first wavelength area and the second wavelength area. The reflection adjusting material layer may absorb light of a wavelength that is out of red, green, or blue light emitting wavelength ranges emitted from the light emitting diode. As described above, since the reflection adjusting material absorbs light of a wavelength that is not included in the wavelength range of red, green, or blue emitted from the light emitting diode, it is possible to prevent or minimize a decrease in the luminance of the display device, and at the same time, it is possible to prevent or minimize a decrease in the luminous efficiency of the display device and to improve visibility.

In an embodiment, the reflection adjusting material may be provided as an organic material layer including a dye, a pigment, or a combination thereof. The reflection adjusting material may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, an xanthene-based compound, a diimmonium-based compound, a dipyrromethene-based compound, a cyanine-based compound, and a combination thereof.

In an embodiment, reflectance measured in a specular component included (SCI) mode on a surface of the reflection adjusting material may be about 10% or less. For example, the reflection adjusting layer may absorb external light reflection of the display device, so that visibility may be improved.

In an embodiment, the reflection adjusting material may have transmittance in a range of about 64% to about 72%. The transmittance of the reflection adjusting material may be adjusted according to a content of a pigment and/or a dye contained in the reflection adjusting material.

In an embodiment including the reflection adjusting material, a capping layer AL1 and a low reflective layer AL2 may be additionally formed between the cathode (Cathode) and the encapsulation layer 400.

The capping layer AL1 may serve to improve the luminous efficiency of the light emitting diode according to the principle of constructive interference. The capping layer AL1 may include, for example, a material having a refractive index of 1.6 or more with respect to light having a wavelength of about 589 nm.

The capping layer AL1 may be an organic capping layer including an organic material, an inorganic capping layer including an inorganic material, or a composite capping layer including an organic material and an inorganic material. For example, the capping layer AL1 may include a carbocyclic compound, a heterocyclic compound, an amine group-containing compound, porphyrin derivatives, phthalocyanine derivatives, naphthalocyanine derivatives, an alkali metal complex, an alkaline earth metal complex, or a combination thereof. The carbocyclic compound, the heterocyclic compound, and the amine group-containing compound may be selectively substituted with a substituent including O, N, S, Se, Si, F, Cl, Br, I or a combination thereof.

The low reflective layer AL2 may be disposed on the capping layer AL1. The low reflective layer AL2 may overlap the entire surface of the substrate 110.

The low reflective layer AL2 may include an inorganic material having low reflectance, and for example, may include a metal or a metal oxide. In case that the low reflective layer AL2 may include the metal, for example, it may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In case that the low reflective layer AL2 may include the metal oxide, it may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination thereof as one constituent compound.

In an embodiment, an absorption coefficient (k) of the inorganic material included in the low reflective layer AL2 may be about 4.0 or less and about 0.5 or more ($0.5<k\leq4.0$). The inorganic material included in the low reflective layer AL2 may have a refractive index (n) of about 1 or more ($n\geq1.0$).

The low reflective layer AL2 induces destructive interference between the light incident inside the display device and the light reflected from the metal disposed under the low reflective layer AL2, thereby reducing external light reflectivity. Accordingly, it is possible to improve the display quality and visibility of the display device by reducing the external light reflectance of the display device through the low reflective layer AL2.

In an embodiment, the capping layer AL1 may be omitted so that the low reflective layer AL2 may be in contact with the cathode (Cathode).

The encapsulation layer 400 is positioned on the low reflective layer AL2, and the other elements are the same as those of FIG. 13, so descriptions thereof will be omitted.

While this disclosure has been described in connection with what are practical embodiments, it is to be understood that the disclosure is not limited to the disclosed embodiments, but, on the contrary, is intended to cover various modifications and equivalent arrangements included within the spirit and scope of the appended claims.

What is claimed is:

1. A light emitting display device, comprising:
a light emitting diode disposed on a substrate and including a light emitting layer;
a pixel defining layer having an opening corresponding to the light emitting layer;
light blocking linear patterns disposed on the pixel defining layer and the light emitting layer and extending in a first direction;
a color converting layer disposed between the light blocking linear patterns; and
an upper transparent organic layer disposed between the light blocking linear patterns and disposed on the color converting layer.

2. The light emitting display device of claim 1, wherein the light blocking linear patterns include a first light blocking linear pattern and a second light blocking linear pattern, and
the first light blocking linear pattern does not overlap the opening of the pixel defining layer in a plan view, and the second light blocking linear pattern intersects the opening of the pixel defining layer in the first direction.

3. The light emitting display device of claim 2, wherein the second light blocking linear pattern intersects the light emitting layer in a plan view, and overlaps the light emitting layer in a plan view.

4. The light emitting display device of claim 2, wherein a width the first light blocking linear pattern in a direction perpendicular to the first direction is greater than a width of the second light blocking linear pattern in the direction perpendicular to the first direction.

5. The light emitting display device of claim 2, wherein a height of the color converting layer is about 15% or more and about 85% or less than a height of the first light blocking linear pattern.

6. The light emitting display device of claim 5, wherein a height of the upper transparent organic layer corresponds to a remaining height of the first light blocking linear pattern.

7. The light emitting display device of claim 1, further comprising:

a transparent scattering layer disposed between the light blocking linear patterns and disposed below the upper transparent organic layer and replacing the color converting layer.

8. The light emitting display device of claim 2, wherein a light blocking member and a color filter are disposed on the light blocking linear patterns and the upper transparent organic layer;

the light blocking member has an opening overlapping the opening of the pixel defining layer in a plan view; and the color filter is disposed within the opening of the light blocking member.

9. The light emitting display device of claim 8, further comprising:

an additional light blocking linear pattern and the light blocking member are made of a same material at a position overlapping the second light blocking linear pattern in a plan view.

10. The light emitting display device of claim 2, wherein the light blocking linear patterns have a viewing angle so that light emitted from the light emitting layer is not emitted at a selectable angle or more with respect to a normal line, and the viewing angle is about 30 degrees.

11. A vehicle comprising:

a first light emitting display device, wherein the first light emitting display device includes:

a light emitting diode disposed on a substrate and including a light emitting layer;

a pixel defining layer having an opening corresponding to the light emitting layer;

light blocking linear patterns disposed on the pixel defining layer and the light emitting layer and extending in a first direction;

a color converting layer disposed between the light blocking linear patterns; and an upper transparent organic layer disposed between the light blocking linear patterns and disposed on the color converting layer.

12. The vehicle of claim 11, wherein the light blocking linear patterns include a first light blocking linear pattern and a second light blocking linear pattern, and the first light blocking linear pattern does not overlap the opening of the pixel defining layer in a plan view and the second light blocking linear pattern intersects the opening of the pixel defining layer in the first direction.

13. The vehicle of claim 12, wherein the second light blocking linear pattern intersects the light emitting layer in a plan view, and overlaps the light emitting layer in a plan view.

14. The vehicle of claim 12, wherein a width the first light blocking linear pattern in a direction perpendicular to the first direction is greater than a width of the second light blocking linear pattern in the direction perpendicular to the first direction.

15. The vehicle of claim 12, wherein a height of the color converting layer is about 15% or more and about 85% or less than a height of the first light blocking linear pattern, and a height of the upper transparent organic layer corresponds to a remaining height of the first light blocking linear pattern.

16. The vehicle of claim 11, further comprising:

a transparent scattering layer disposed between the light blocking linear patterns and disposed below the upper transparent organic layer and replacing the color converting layer.

17. The vehicle of claim 12, wherein a light blocking member and a color filter are disposed on the light blocking linear patterns and the upper transparent organic layer;

the light blocking member has an opening overlapping the opening of the pixel defining layer in a plan view; and the color filter is disposed within the opening of the light blocking member.

18. The vehicle of claim 17, further comprising:

an additional light blocking linear pattern and the light blocking member made of a same material at a position overlapping the second light blocking linear pattern in a plan view.

19. The vehicle of claim 12, wherein the light blocking linear patterns have a viewing angle so that light emitted from the light emitting layer is not emitted at a selectable angle or more with respect to a normal line, and the viewing angle is about 30 degrees.

20. The vehicle of claim 11, wherein the vehicle includes a second light emitting display device, and the second light emitting display device includes:

a light emitting diode disposed on a substrate and including a light emitting layer;

a pixel defining layer having an opening corresponding to the light emitting layer; and light blocking linear patterns disposed on the pixel defining layer and the light emitting layer and extending in a second direction different from the first direction.

* * * * *